United States Patent [19]
Susak

[11] Patent Number: 5,506,509
[45] Date of Patent: Apr. 9, 1996

[54] CIRCUIT AND METHOD OF MEASURING SQUIB RESISTANCE

[75] Inventor: David M. Susak, Phoenix, Ariz.

[73] Assignee: Motorola, Inc., Schaumburg, Ill.

[21] Appl. No.: 348,631

[22] Filed: Dec. 5, 1994

[51] Int. Cl.⁶ .................................................. G01R 27/02
[52] U.S. Cl. ........................ 324/550; 324/705; 324/725; 340/638; 365/201
[58] Field of Search .................................... 324/550, 705, 324/713, 721, 725; 340/638; 323/315; 365/201

[56] References Cited

U.S. PATENT DOCUMENTS

| | | | |
|---|---|---|---|
| 4,518,869 | 5/1985 | Herold | 324/705 |
| 5,059,916 | 10/1991 | Johnson | 324/713 |

Primary Examiner—Kenneth A. Wieder
Assistant Examiner—Jose M. Solis
Attorney, Agent, or Firm—Robert D. Atkins

[57] ABSTRACT

A resistance measuring circuit (10) generates a predetermined reference voltage and impresses that reference voltage across a squib detonation device (12). The resulting current flowing through the squib is mirrored by a current mirror (42,52,54) for providing multiple mirrored currents. The mirrored currents are compared to known current sources (58,60). The output signals go high or low depending on whether the mirrored currents are greater than or less than the fixed current sources. The output signals provide an indication as to whether the measured squib resistance is within a specified resistance range. The current sources may be precisely matched to maintain high accuracy in measuring the resistance.

25 Claims, 2 Drawing Sheets

CIRCUIT AND METHOD OF MEASURING SQUIB RESISTANCE

BACKGROUND OF THE INVENTION

The present invention relates in general to resistance measuring circuits and, more particularly, to measuring squib resistance to verify proper operation.

A squib is a detonator wire used for example to ignite the explosive charge that inflates an air bag in an automobile. The squib is a low resistance conductive wire with multiple coatings of an explosive material. At impact during an automobile accident, a large current flows through the squib, heats the wire, and ignites the explosive layers. This initial explosion sets off a secondary charge that inflates the air bag to protect the occupants.

The squib comes in a variety of resistance values, say from 1.0 ohms to 5.0 ohms. Any squib below 1.0 ohm is considered shorted and defective. Likewise, any squib above 5.0 ohms is considered open and defective. A monitoring circuit in the automobile continuously checks the squib resistance and reports values outside the acceptable range as a warning light on the console display.

In the prior art, the monitoring circuit injects current through the squib wire and measures the resulting voltage drop. The injection current is generally limited to about 30.0 milliamps because higher currents tend to degrade the squib's performance such as the time constant to detonation. Thirty milliamps injected into one ohm develops thirty millivolts across the squib. The squib voltage is typically amplified across a differential amplifier having a gain of say ten to increase the measured signal to usable levels. The amplified squib voltage may be converted to a digital signal for processing through a microprocessor, or processed through analog comparators to determine if the squib resistance is within the acceptable range.

It is desirable to maintain the accuracy of measuring squib resistance to say within ±10%. Unfortunately, the input offset voltage of the differential amplifier is about 3.0 millivolts which substantially takes all the error budget. In addition, there is error associated with the 10:1 resistor ratios around the amplifier due to temperature and process variation. To compound the problem, squib monitoring circuits often come in dual or quad packages to measure multiple squibs for both driver and passenger sides. The error in one resistance measuring amplifier is sufficiently large as to become the dominate factor in production yield loss. Adding multiple resistance measuring amplifiers to the same semiconductor die could adversely impact the production yield. For example, if one amplifier on a semiconductor die yields 90%, two amplifiers on one die would yield 81%, and four amplifiers on one die would yield 64%. To avoid poor yield, prior art designs have resorted to using a single resistance measuring amplifier and multiplexing in the various squib voltage readings. However, the analog multiplexers also introduce offset error which further reduces the accuracy of the readings.

Hence, a need exists for accurately measuring squib resistance to verify proper operation.

DETAILED DESCRIPTION OF THE PREFERRED EMBODIMENT

Figure 1:
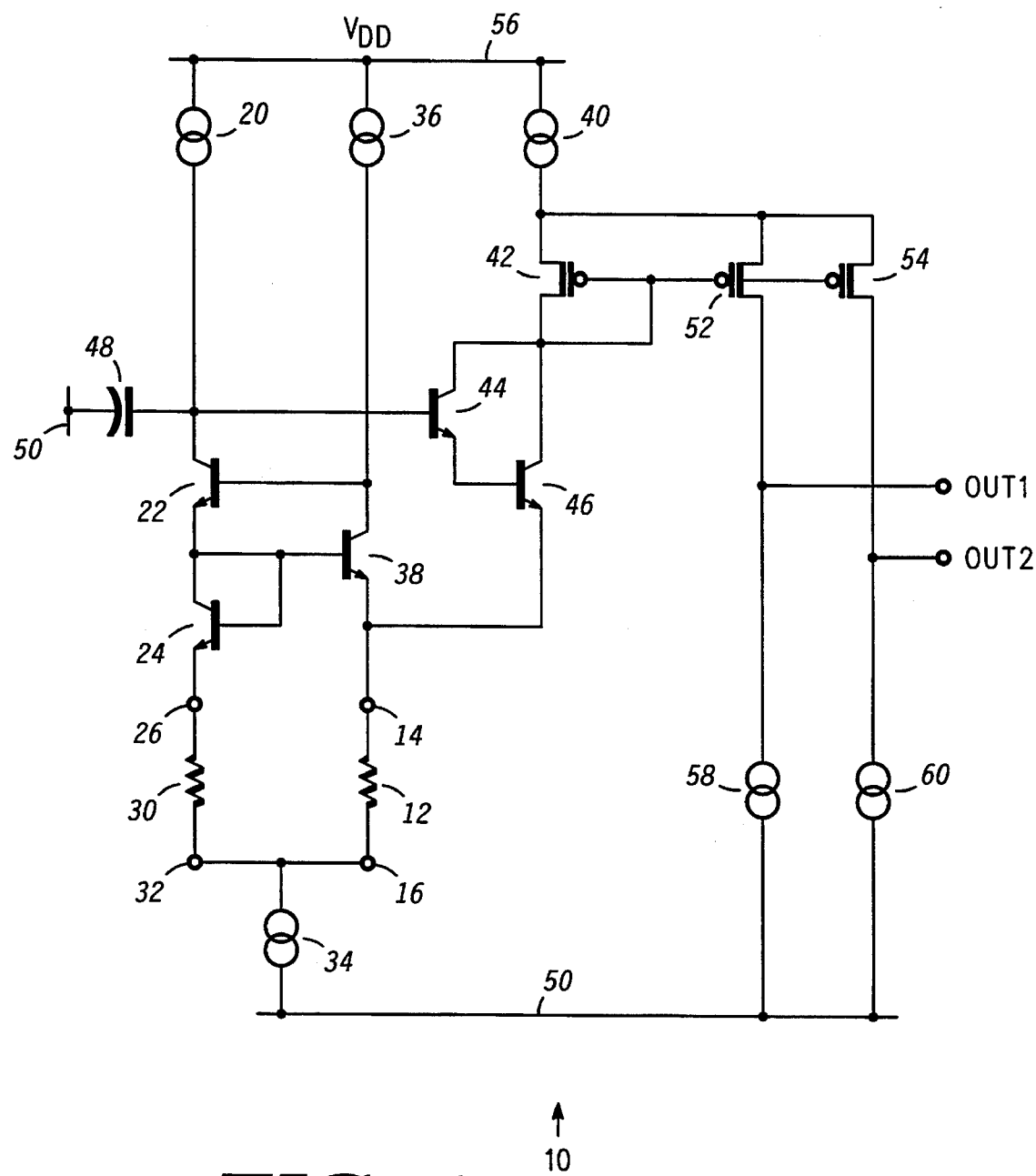
FIG. 1 is a schematic diagram illustrating a resistance measuring circuit.

A resistance measuring circuit 10 is shown in FIG. 1 suitable for manufacturing as an integrated circuit using conventional integrated circuit processes. A squib detonation device is a conducting element illustrated as resistor 12 that is externally coupled between terminals 14 and 16. Assume for the present example that squib resistor 12 is nominally 3.0 ohms. Measuring circuit 10 continuously monitors the resistance of the squib by impressing a voltage across terminals 14 and 16 and mirroring the resulting current flow through MOS transistors. Modern semiconductor manufacturing processes can match MOS current sources to within 1%. Thus, measuring current allows resistance measuring circuit 10 to maintain the test accuracy for the squib to say ±10%.

Current source 20 has an output coupled to the collector of transistor 22. The emitter of transistor 22 is coupled to the collector and base of diode-configured transistor 24. The emitter of transistor 24 is coupled to terminal 26. An external reference resistor 30 is coupled between terminal 26 and terminal 32. Resistor 30 is selected at 30.0 ohms. A current source 34 has an output coupled to terminals 16 and 32 and sinks a 35.0 milliamp (ma) current. Current source 36 has an output coupled to the collector of transistor 38 which includes an emitter coupled to terminal 14. The base of transistor 22 is coupled to the collector of transistor 38, while the base of transistor 38 is coupled to the base and collector of transistor 24 for providing a current mirror operation.

A current source 40 has an output coupled to the source of MOS transistor 42. Current sources 34 and 40 are set to 35.0 ma to limit the current flow and protect squib resistor 12. The gate and drain of transistor 42 are coupled to the collectors of transistors 44 and 46. The emitter of transistor 44 is coupled to the base of transistor 46 in a Darlington configuration. The emitter of transistor 46 is coupled to terminal 14, while the base of transistor 44 is coupled to the output of current source 20. Capacitor 48 is coupled between the output of current source 20 and power supply conductor 50 operating at ground potential. Capacitor 48 is selected at 20.0 picofarads for providing frequency compensation.

The gate and drain of transistor 42 are further coupled to the gates of transistors 52 and 54. The sources of MOS transistors 52 and 54 are coupled to the output of current source 40. Current sources 20, 36 and 40 are referenced to power supply conductor 56 operating at a positive power supply potential such as $V_{DD}$=5.0 volts. The drain of transistor 52 is coupled to the output of current source 58 and provides an output signal OUT1. The drain of transistor 54 is coupled to the output of current source 60 and provides an output signal OUT2. Current sources 34, 58 and 60 are referenced to power supply conductor 50. The OUT1 and OUT2 may be converted to logic levels and sent to a microprocessor (not shown) in the automobile that reports squib status to the occupants.

Current sources 20, 36, 34, 40, 58, and 60, and transistors 42, 52 and 54 are precision MOS transistors providing predetermined currents with 1% accuracy. Current source 20 supplies a 1.0 ma current through transistors 22 and 24 to reference resistor 30 that generates a reference voltage of 30.0 millivolts (mv) between terminals 26 and 32. Current source 36 supplies a 1.0 ma current through transistor 38 to squib resistor 12. Transistors 22, 24 and 38 operate as a well known Wilson current mirror that has substantially zero base current error between the two sides. Transistors 24 and 38 should be matching transistors. The negative feedback from the collector of transistor 22 through transistors 44 and 46 to terminal 14 regulates the voltage across the squib resistor to be substantially equal to the reference voltage across resistor 30. The current flowing through the emitter of transistor 24 is substantially equal to the current flowing through the emitter of transistor 38. Since transistors 24 and 38 conduct equal emitter currents, their base-emitter junction potentials ($V_{be}$) must also be equal. The voltage at terminal 14 is equal to the voltage at terminal 26 plus the $V_{be}$ of transistor 24 and minus the $V_{be}$ of transistor 38. Therefore, the voltage at terminal 14 is equal to the voltage at terminal 26. In other words, the voltage reference circuit comprising current sources 20 and 36, transistors 22, 24, 38, 44 and 46, and reference resistor 30 impresses the same 30.0 mv reference voltage across terminals 14 and 16 of squib resistor 12.

Squib resistor 12 conducts 10.0 ma given a resistance value of 3.0 ohms. Since current source 36 supplies 1.0 ma, the other 9.0 ma flows through transistors 44 and 46 to transistor 42. The 9.0 ma current in transistor 42 is mirrored in transistors 52 and 54. Current source 58 sinks a 29.0 ma reference current while current source 60 sinks a 5.0 ma reference current. The 9.0 ma current from transistor 52 is compared to the 29.0 ma reference current sunk by current source 58. Since the 9.0 ma current from transistor 52 cannot supply the 29.0 ma sunk by current source 58, the OUT1 voltage goes to a low state because the current sources have high output impedance. The 9.0 ma current from transistor 54 is compared to the 5.0 ma reference current sunk by current source 60. The 9.0 ma current from transistor 54 supplies more than the 5.0 ma sunk by current source 60. The OUT2 voltage goes to a high state since the current sources have high output impedance. OUT1 having a low state and OUT2 having a high state indicates that squib resistor 12 has an acceptable resistance value.

Now assume squib resistor 12 goes to less than 1.0 ohm which is below the minimum acceptable value. The 30.0 mv across terminals 14 and 16 causes more than 30.0 ma of current to flow through resistor 12. Current source 36 supplies 1.0 ma so more than 29.0 ma flows through transistors 42, 44 and 46. Transistor 52 supplies more than the 29.0 ma sunk by current source 58. The OUT1 voltage goes to a high state. Likewise, transistor 54 supplies more than the 5.0 ma sunk by current source 60 and the OUT2 voltage goes to a high state. OUT1 having a high state and OUT2 having a high state indicates that squib resistor 12 has less than the acceptable resistance value.

If squib resistor 12 goes to more than 5.0 ohms, the 30.0 mv across terminals 14 and 16 causes less than 6.0 ma of current to flow through resistor 12. Current source 36 supplies 1.0 ma so less than 5.0 ma flows through transistors 42, 44 and 46. Transistor 52 supplies less than the 29.0 ma sunk by current source 58. The OUT1 voltage goes to a low state. Likewise, transistor 54 supplies less than the 5.0 ma sunk by current source 60 and the OUT2 voltage goes to a low state. OUT1 having a low state and OUT2 having a low state indicates that squib resistor 12 has more than the acceptable resistance value.

In an alternate embodiment, current sources 58 and 60 may be made equal to conduct 1.0 ma currents. The sizes of transistors 42, 52 and 54 are ratio'ed to provide the proper trip points. For example, transistor 42 is made a 29X device, while transistor 52 is made a 1X device, and transistor 54 is made a 5.8X device. When squib resistor 12 is equal to 3.0 ohms, the 30.0 my across terminals 14 and 16 causes 10.0 ma of current to flow through resistor 12 and 9.0 ma to flow through transistors 42, 44 and 46. The 29:1 ratio between transistors 42 and 52 causes less than 1.0 ma to flow through transistor 52 which is less than the 1.0 ma current source 58. The OUT1 voltage goes to a low state. The 29:5.8 ratio between transistors 42 and 54 causes more than 1.0 ma to flow through transistor 54 which is more than the 1.0 ma current source 60. The OUT2 voltage goes to a high state. Resistance measuring circuit 10 thus indicates that squib resistor 12 has the acceptable resistance value.

When squib resistor 12 is less than 1.0 ohm, the 30.0 mv across terminals 14 and 16 causes more than 30.0 ma of current to flow through resistor 12 and more than 29.0 ma to flow through transistors 42, 44 and 46. The 29:1 ratio between transistors 42 and 52 causes more than 1.0 ma to flow through transistor 52 which is more than the 1.0 ma current source 58. The OUT1 voltage goes to a high state. The 29:5.8 ratio between transistors 42 and 54 causes more than 1.0 ma to flow through transistor 54 which is more than the 1.0 ma current source 60. The OUT2 voltage goes to a high state. Resistance measuring circuit 10 thus indicates that squib resistor 12 has less than the acceptable resistance value.

When squib resistor 12 is more than 5.0 ohms, the 30.0 mv across terminals 14 and 16 causes less than 6.0 ma of current to flow through resistor 12 and less than 5.0 ma to flow through transistors 42, 44 and 46. The 29:1 ratio between transistors 42 and 52 causes less than 1.0 ma to flow through transistor 52 which is less than the 1.0 ma current source 58. The OUT1 voltage goes to a low state. The 29:5.8 ratio between transistors 42 and 54 causes less than 1.0 ma to flow through transistor 54 which is less than the 1.0 ma current source 60. The OUT2 voltage goes to a low state. Resistance measuring circuit 10 thus indicates that squib resistor 12 has more than the acceptable resistance value.

In another embodiment, resistance measuring circuit 10 is expandable to provide more trip points. Additional transistors like 52 and 54 are mirrored off the gate of transistor 42. Corresponding current sources like 58 and 60 are coupled to the drains of the additional transistors to provide more outputs OUT3, OUT4, etc. The additional outputs provide more measurable ranges of resistance values of the squib resistor. The trip points may be taken between any two outputs. Resistance measuring circuit 10 may also be duplicated on the same IC die to provide independent measuring of multiple squibs.

Figure 2:
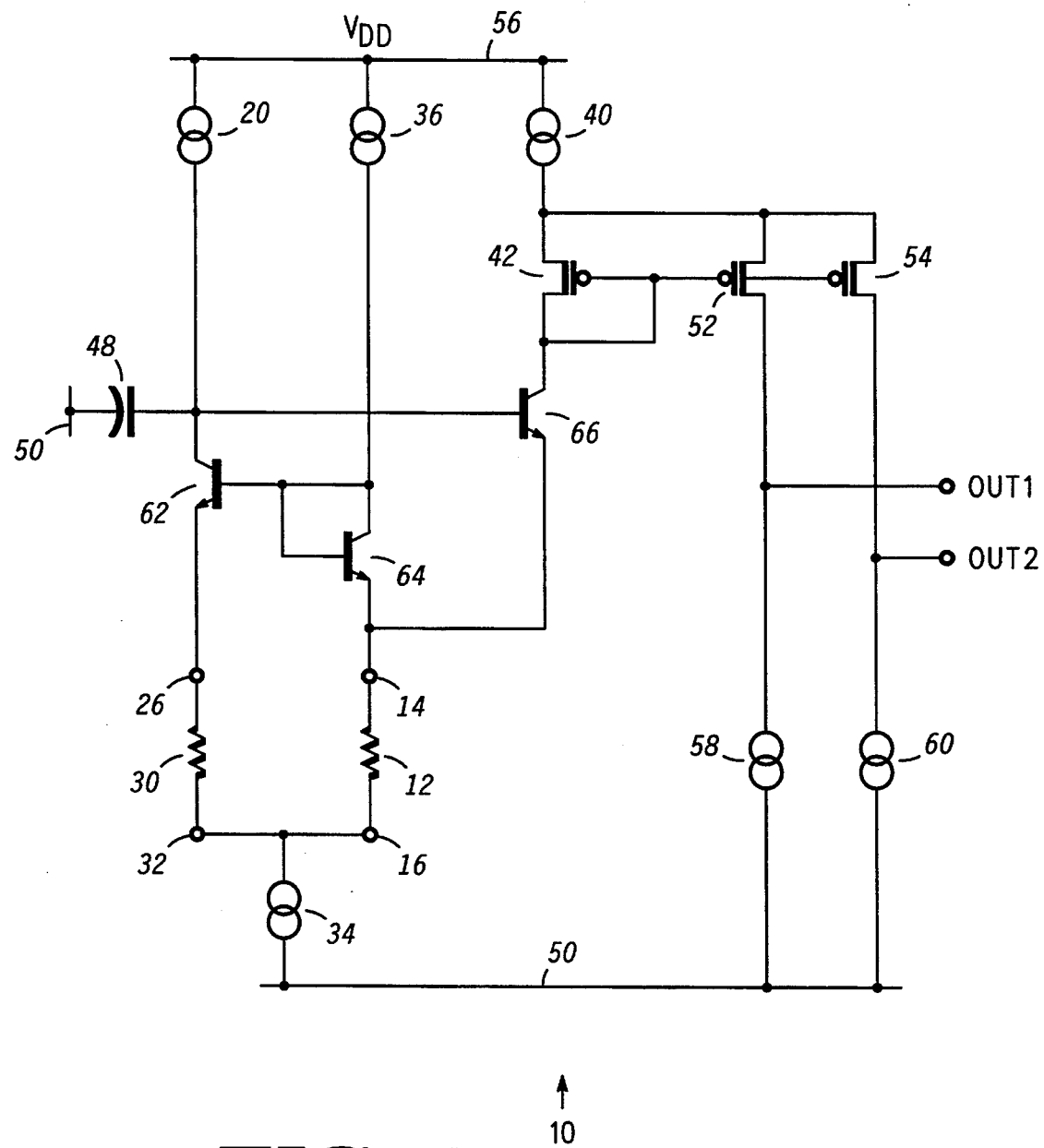
FIG. 2 is a schematic diagram illustrating an alternate embodiment of the resistance measuring circuit.

Yet another embodiment of resistance measuring circuit 10 is shown in FIG. 2. Circuit components having a similar function are assigned the same reference numbers used in FIG. 1. The current mirror arrangement 22, 24 and 38 in FIG. 1 is replaced with current mirror arrangement 62 and 64. The Darlington transistor arrangement 44 and 46 is replaced with a single transistor 66. The resistance measuring circuit otherwise performs as described for FIG. 1.

By now it should be appreciated that the present invention provides a resistance measuring circuit that impresses a known voltage across the resistor to be measured. The resulting current is mirrored and compared to known fixed current sources. The output signals go high or low depending on whether the mirrored currents are greater than or less than the fixed current sources. The output signals provide an indication as to whether the measured squib resistance is within a specified resistance range. The current sources are precisely matched to maintain high accuracy in measuring the resistance.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit for measuring resistance of a conducting element, comprising:

a voltage reference circuit for generating first and second reference voltages having substantially equal values at first and second terminals where the conducting element is coupled between said first terminal and a first power supply conductor;

a reference resistor coupled between said second terminal of said voltage reference circuit and said first power supply conductor;

a current mirror circuit having an input coupled to said first terminal of voltage reference circuit for providing a current flowing through the conducting element; and a first current source having an output coupled to a first output of said current mirror circuit for providing a first output signal indicating resistance of the conducting element.

2. The circuit of claim 1 further including a second current source having an output coupled to a second output of said current mirror circuit for providing a second output signal indicating resistance of the conducting element.

3. The circuit of claim 2 wherein said voltage reference circuit includes:

a third current source having an output;

a fourth current source having an output;

a first transistor having a base, an emitter and a collector, said collector being coupled to said output of said third current source, said base being coupled to said output of said fourth current source;

a second transistor having a base, an emitter and a collector, said base being coupled to said emitter of said first transistor, said collector being coupled to said output of said fourth current source, said emitter being coupled to said first terminal of the conducting element; and a third transistor having a base, an emitter and a collector, said base and collector being coupled to said emitter of said first transistor, said emitter being coupled to a third terminal of the circuit.

4. The circuit of claim 3 wherein said voltage reference circuit further includes a fourth transistor having a base, an emitter and a collector, said base being coupled to said output of said third current source, said collector being coupled to said input of said current mirror circuit, said emitter being coupled to said first terminal of the conducting element.

5. The circuit of claim 4 wherein said voltage reference circuit further includes a fifth transistor having a base, an emitter and a collector, said base being coupled to said output of said third current source, said collector being coupled to said input of said current mirror circuit, said emitter being coupled to said base of said fourth transistor.

6. The circuit of claim 5 wherein said current mirror circuit includes:

a sixth transistor having a gate, a drain and a source, said source being coupled to a second power supply conductor, said gate and drain being coupled together to said collectors of said fourth and fifth transistors;

a seventh transistor having a gate, a drain and a source, said source being coupled to said second power supply conductor, said gate being coupled to said gate of said sixth transistor, said drain being coupled to said output of said first current source; and an eighth transistor having a gate, a drain and a source, said source being coupled to said second power supply conductor, said gate being coupled to said gate of said sixth transistor, said drain being coupled to said output of said second current source.

7. The circuit of claim 6 wherein the conducting element is a squib detonation device.

8. The circuit of claim 7 further including:

a fifth current source having an output coupled to said sources of said sixth, seventh and eighth transistors; and a sixth current source coupled between said first power supply conductor and a common node at distal ends of said reference resistor and the conducting element.

9. The circuit of claim 2 wherein said voltage reference circuit includes:

a third current source having an output;

a fourth current source having an output;

a first transistor having a base, an emitter and a collector, said collector being coupled to said output of said third current source, said emitter being coupled to a third terminal of the circuit; and a second transistor having a base, an emitter and a collector, said base and collector being coupled to said base of said first transistor and to said output of said fourth current source, said emitter being coupled to said first terminal of the conducting element.

10. The circuit of claim 9 wherein said voltage reference circuit further includes a third transistor having a base, an emitter and a collector, said base being coupled to said output of said third current source, said collector being coupled to said input of said current mirror circuit, said emitter being coupled to said first terminal of the conducting element.

11. The circuit of claim 10 wherein said current mirror circuit includes:

a fourth transistor having a gate, a drain and a source, said source being coupled to a second power supply conductor, said gate and drain being coupled together to said collector of said third transistor;

a fifth transistor having a gate, a drain and a source, said source being coupled to said second power supply conductor, said gate being coupled to said gate of said fourth transistor, said drain being coupled to said output of said first current source; and a sixth transistor having a gate, a drain and a source, said source being coupled to said second power supply conductor, said gate being coupled to said gate of said fourth transistor, said drain being coupled to said output of said second current source.

12. The circuit of claim 11 wherein the conducting element is a squib detonation device.

13. The circuit of claim 12 further including:

a fifth current source having an output coupled to said source of said fourth, fifth, and sixth transistors; and a sixth current source coupled between said first power supply conductor and a common node at distal ends of said reference resistor and the conducting element.

14. A method of measuring resistance of a conducting element, comprising the steps of:

generating first and second reference voltages having substantially equal values at first and second terminals;

conducting current through a reference resistor in response to said first reference voltage to develop a voltage at a distal end of said reference resistor;

impressing said second reference voltage and said voltage developed at said distal end of said reference resistor across the conducting element to cause a current to flow through the conducting element;

mirroring said current flowing through the conducting element for providing a first mirrored current; and comparing said first mirrored current to a first reference current for providing a first output signal indicating resistance of the conducting element.

15. The method of claim 14 further comprising the step of mirroring said current flowing through the conducting element for providing a second mirrored current.

16. The method of claim 15 further comprising the step of comparing said second mirrored current to a second reference current for providing a second output signal indicating resistance of the conducting element.

17. A circuit for measuring resistance between first and second terminals of a conducting element, comprising:

a first current source having an output;

a second current source having an output;

a first transistor having a base, an emitter and a collector, said collector being coupled to said output of said first current source, said base being coupled to said output of said second current source;

a second transistor having a base, an emitter and a collector, said base being coupled to said emitter of said first transistor, said collector being coupled to said output of said second current source, said emitter being coupled to the first terminal of the conducting element;

a third transistor having a base, an emitter and a collector, said base and collector being coupled to said emitter of said first transistor, said emitter being coupled to a third terminal of the circuit;

a fourth transistor having a base, an emitter and a collector, said base being coupled to said output of said first current source, said emitter being coupled to the first terminal of the conducting element;

a current mirror circuit having an input coupled to said collector of said fourth transistor; and a third current source having an output coupled to a first output of said current mirror circuit for providing a first output signal indicating resistance of the conducting element.

18. The circuit of claim 17 further including a fourth current source having an output coupled to a second output of said current mirror circuit for providing a second output signal indicating resistance of the conducting element.

19. The circuit of claim 18 further including a fifth transistor having a base, an emitter and a collector, said base being coupled to said output of said first current source, said collector being coupled to said input of said current mirror circuit, said emitter being coupled to said base of said fourth transistor.

20. The circuit of claim 19 wherein said current mirror circuit includes:

a sixth transistor having a gate, a drain and a source, said source being coupled to a first power supply conductor, said gate and drain being coupled together to said collectors of said fourth and fifth transistors;

a seventh transistor having a gate, a drain and a source, said source being coupled to said first power supply conductor, said gate being coupled to said gate of said sixth transistor, said drain being coupled to said output of said third current source; and an eighth transistor having a gate, a drain and a source, said source being coupled to said first power supply conductor, said gate being coupled to said gate of said sixth transistor, said drain being coupled to said output of said fourth current source.

21. The circuit of claim 20 further including:

a fifth current source having an output coupled to said sources of said sixth, seventh and eighth transistors;

a reference resistor coupled between said third terminal of the circuit and a fourth terminal of the circuit; and a sixth current source having an output coupled to said fourth terminal and the second terminal of the conducting element.

22. A circuit for measuring resistance between first and second terminals of a conducting element, comprising:

a first current source having an output;

a second current source having an output;

a first transistor having a base, an emitter and a collector, said collector being coupled to said output of said first current source, said emitter being coupled to a third terminal of the circuit;

a second transistor having a base, an emitter and a collector, said base and collector being coupled to said base of said first transistor and to said output of said second current source, said emitter being coupled to the first terminal of the conducting element;

a third transistor having a base, an emitter and a collector, said base being coupled to said output of said first current source, said emitter being coupled to the first terminal of the conducting element;

a current mirror circuit having an input coupled to said collector of said third transistor; and a third current source having an output coupled to a first output of said current mirror circuit for providing a first output signal indicating resistance of the conducting element.

23. The circuit of claim 22 further including a fourth current source having an output coupled to a second output of said current mirror circuit for providing a second output signal indicating resistance of the conducting element.

24. The circuit of claim 23 wherein said current mirror circuit includes:

a fourth transistor having a gate, a drain and a source, said source being coupled to a first power supply conductor, said gate and drain being coupled together to said collector of said third transistor;

a fifth transistor having a gate, a drain and a source, said source being coupled to said first power supply conductor, said gate being coupled to said gate of said fourth transistor, said drain being coupled to said output of said third current source; and a sixth transistor having a gate, a drain and a source, said source being coupled to said first power supply conductor, said gate being coupled to said gate of said fourth transistor, said drain being coupled to said output of said fourth current source.

25. The circuit of claim 24 further including:

a fifth current source having an output coupled to said source of said fourth, fifth, and sixth transistors;

a reference resistor coupled between said third terminal of the circuit and a fourth terminal of the circuit; and a sixth current source having an output coupled to said fourth terminal and the second terminal of the conducting element.

* * * * *